United States Patent

Kun et al.

[15] 3,670,220

[45] June 13, 1972

[54] PN JUNCTIONS IN ZNSE, ZNS, OR ZNS/ZNSE AND SEMICONDUCTOR DEVICES COMPRISING SUCH JUNCTIONS

[72] Inventors: Zoltan K. Kun, Skokie; Robert J. Robinson, Park Ridge, both of Ill.

[73] Assignee: Zenith Radio Corporation, Chicago, Ill.

[22] Filed: Feb. 26, 1971

[21] Appl. No.: 119,240

[52] U.S. Cl. ....................317/237, 148/1.5, 148/190, 252/62.3 ZT, 317/235 J, 317/235 AP, 317/235 AQ

[51] Int. Cl. ....................H01l 7/62

[58] Field of Search ....................317/235 AP, 235 AQ, 237; 252/62.3 ZT; 148/190

[56] References Cited

UNITED STATES PATENTS

| | | | |
|---|---|---|---|
| 3,326,730 | 6/1967 | Mandel et al. | 148/189 |
| 3,459,603 | 8/1969 | Weisberg et al. | 148/1.5 |
| 3,496,429 | 2/1970 | Robinson | 317/237 |
| 3,549,434 | 12/1970 | Aven | 148/186 |
| 3,578,507 | 5/1971 | Chiang et al. | 148/1.5 |
| 3,614,551 | 10/1971 | Jenkins et al. | 317/234 |

*Primary Examiner*—John W. Huckert
*Assistant Examiner*—William D. Larkins
*Attorney*—John J. Pederson

[57] ABSTRACT

PN-junctions are formed in a wide band gap zinc chalcogenide (i.e., zinc selenide, zinc sulfide or a zinc sulfo-selenide by pre-doping a surface layer of an N-doped zinc chalcogenide substrate by in-diffusion of a Group III metal to condition it for conversion to P-type conductivity, and converting the pre-doped surface layer to P-type conductivity by doping it with zinc. The pre-doping and conversion steps may be conducted either simultaneously or sequentially. Well defined PN-junctions are produced, with majority carrier concentrations on the P-conductivity side of the junction of at least $10^{16}$ to $10^{17}$ holes per cubic centimeter.

27 Claims, 4 Drawing Figures

PN JUNCTIONS IN ZNSE, ZNS, OR ZNS/ZNSE AND SEMICONDUCTOR DEVICES COMPRISING SUCH JUNCTIONS

This invention relates to the formation of PN-junctions in semiconductor materials, and more particularly to the formation of such junctions in zinc sulfide, zinc selenide, or a zinc sulfo-selenide, and to semiconductor devices comprising such junctions.

As is well-known in the art, the wide-band gap zinc chalcogenides in general and zinc sulfide, zinc selenide and the zinc sulfo-selenides in particular are not convertible to P-type conductivity by the use of ordinary or conventional semiconductor doping processes. N-type conductivity with low resistivity can be obtained in such materials by the process taught and claimed in the Catano U.S. Pat. No. 3,544,468, issued Dec. 1, 1970. However, it has not generally been feasible to form stable and well defined PN junctions in wide-band gap zinc chalcogenide materials, with high and uniform conductivity on both sides of the junction.

It is a primary object of the invention to provide new and improved PN junction semiconductor devices constructed of wide-band gap zinc chalcogenide materials.

It is a further object of the present invention to provide a new and improved method of producing PN junctions in wide-band gap zinc chalcogenide materials.

It is another object of the invention to provide a process for producing PN-junctions in zinc sulfide, zinc selenide or a zinc sulfo-selenide with majority carrier concentrations at least of the order of $10^{16}$ to $10^{17}$ holes per cubic centimeter on the P-side of the junction.

It is still another object of the invention to provide a method for producing visible light emitting diodes of zinc chalcogenide materials.

Yet another object of the invention is to provide a method of forming PN-junctions in zinc sulfide, zinc selenide, or a zinc sulfo-selenide, by a process which yields such junctions with efficiency and high reproducibility.

In accordance with the invention, a method of producing PN-junctions in wide-band gap zinc chalcogenide materials (i.e., zinc sulfide, zinc selenide and the zinc sulfo-selenides) comprises the step first of providing an N-type substrate of the desired zinc chalcogenide material, as for example by the process described and claimed in the above-identified Catano patent. A P-convertible surface layer is formed on the N-type substrate by pre-doping with a Group III metal, and the surface layer is converted to P-type conductivity by zinc doping of the pre-doped surface layer.

Figure 1:
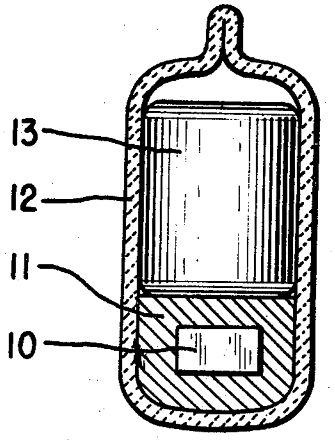
Figure 2:
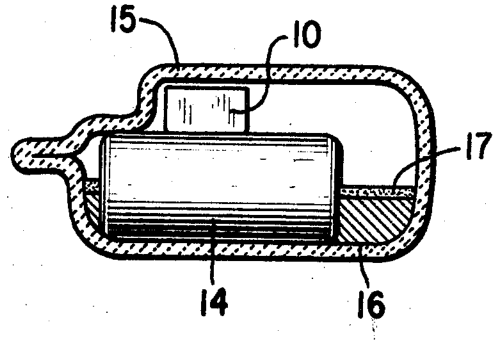
Figure 3:
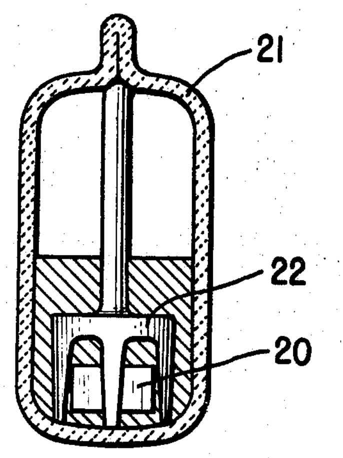
Figure 4:
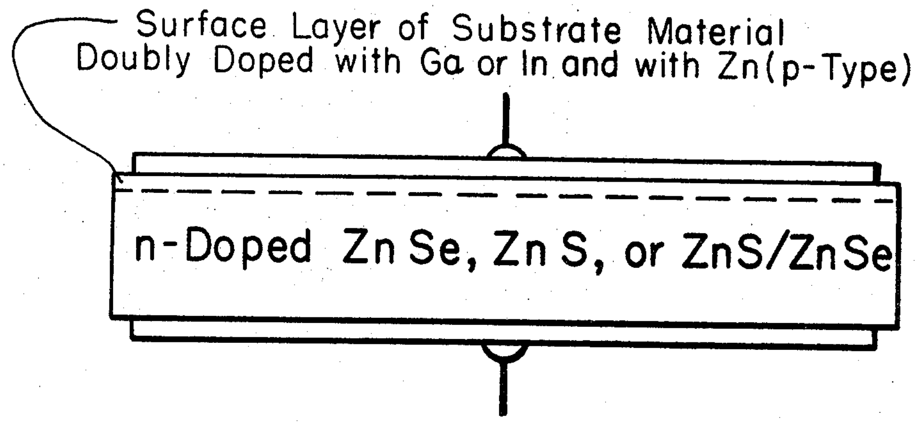

The features of the present invention which are believed to be novel are set forth with particularity in the appended claims. The invention, together with further objects and advantages thereof, may best be understood by reference to the following description taken in conjunction with the accompanying drawing in which:

FIGS. 1–3 are cross-sectional diagrammatic views illustrating certain processing steps of the inventive methods; and FIG. 4 is a schematic representation of PN-junction semiconductor device embodying the invention.

More particularly, in accordance with the present invention, PN-junctions are made in substrates of the wide-band gap zinc chalcogenides by a process which is simple and inexpensive, yielding highly reproducible results with majority carrier concentrations on the P-side of the junction of the order of $10^{16}$ holes per cubic centimeter or more. Hole concentrations as high as $10^{17}$ holes per cubic centimeter have been obtained.

The zinc chalcogenides, and particularly zinc sulfide, zinc selenide and alloys or solid solutions of zinc sulfide and zinc selenide (known as the zinc sulfo-selenides) are known as semiconductor materials whose band gaps are sufficiently wide to cause such materials, when properly excited, to emit light in the visible spectrum. Such materials, therefore, are logically and naturally ideal candidates for use in semiconductor light emitting diodes, except for the fact that these materials are not readily p-convertible and it is therefore extremely difficult to make PN junctions in such materials.

The present invention is premised on the discovery that certain Group III*a* metals, and particularly gallium, indium and thallium, when applied in doping concentrations, exert an unexpected effect on the wide-band zinc chalcogenide semiconductor materials. From their position in the periodic table, Group III*a* metals would normally be expected to function as donors for Group II–VI compound semiconductor materials. Indeed, aluminum, gallium, indium and thallium are known to function as donors for the cadmium salts, and aluminum an function as a donor for the zinc chalcogenides if the doping process is carried out in an atmosphere dominated by excess zinc. However, gallium, indium and thallium cannot be made to function successfully as donors with the wide band gap zinc chalcogenides, and heretofore these Group IIIa metals have not been successfully employed in any process for imparting useful conductivity, either N-type or P-type, to zinc sulfide, zinc selenide or a zinc sulfo-selenide. In accordance with the present invention, it has been discovered that elemental gallium, indium and thallium may be employed in doping concentrations in a successful process for imparting P-type conductivity to the wide-band gap zinc chalcogenides.

More particularly, in accordance with the present invention, a substrate of such a wide-band gap zinc chalcogenide material, which has been rendered N-conductive by a process such as the Catano process, is doubly doped with a Group III*a* metal, i.e., gallium, indium or thallium, and with zinc, to provide a thin surface layer of high P-type conductivity. In practice, double doping can be effected by employing sequential discrete processing steps; in some instances, single-step processing with the simultaneous in-diffusion of both dopants has been found effective, as specifically disclosed and claimed in the copending application of Zoltan K. Kun and Robert J. Robinson Ser. No. 119,370, filed concurrently herewith for SINGLE-STEP PROCESS FOR MAKING P-N JUNCTIONS IN ZINC SELENIDE, and assigned to the same assignee of the present application.

More particularly, the method of forming PN-junction in a wide-band gap zinc chalcogenide semiconductor material in accordance with the present invention comprises providing a high-conductivity N-type substrate of zinc selenide, zinc sulfide, or a zinc sulfo-selenide semiconductor material. A surface layer of the substrate is pre-doped by in-diffusion of a Group III metal to condition it for conversion to P-type conductivity, and the pre-doped layer is converted to P-type conductivity by doping it with zinc. The pre-doping step is preferably effected by submerging the substrate in a melt of the Group III metal. When the substrate is zinc selenide or a zinc sulfo-selenide, the melt preferably contains zinc in addition to the Group III metal. Gallium is the preferred pre-dopant, although indium and thallium may be employed instead, and the pre-doping may be accomplished by vapor- or solid-phase in-diffusion instead of by the preferred liquid phase in-diffusion process. Preferred pre-dopant concentrations are best determined empirically, but in any event have been found to be of the order of 0.1 percent or less by weight of the entire sample. Pre-dopant concentrations of 0.001 percent by weight of the whole sample have been found effective.

Conversion of the pre-doped layer to P-type conductivity by zinc doping may be effected either by vapor phase in-diffusion of the zinc or by submersion of the pre-doped substrate in a zinc melt. Whether the conversion to P-type conductivity is effected by in-diffusion of zinc atoms to displace the Group III metal atoms in the pre-doped lattice, or whether the zinc doping step merely prevents out-diffusion of zinc and permits substitutional zinc doping within the lattice is not known; in any event, it has been found necessary to subject the pre-doped sample to external elemental zinc, and for purposes of the present application, it has been convenient to think and speak in terms of in-diffusion of the zinc during the P-conversion step, and to consider the prevention of out-diffusion as a complete and obvious equivalent.

In another variation of the method, the pre-doping step may be effected by evaporating a surface layer of the Group III metal, in this case preferably gallium, and by subsequently in-diffusing atoms of the Group III metal from the evaporated layer onto the surface of the substrate. In this variant of the process, the zinc doping step is preferably effected by in-diffusion of zinc atoms in vapor phase. Moreover, when the substrate is zinc selenide or a zinc sulfo-selenide, the zinc doping is preferably effected in an atmosphere containing zinc selenide or zinc sulfide vapor.

The method of the present invention is distinguished from methods described in the copending application of Zoltan K. Kun, Ser. No. 118,744 filed Feb. 25, 1971, as a continuation-in-part of application Ser. No. 819,960 filed Apr. 28, 1969 for METHODS OF PRODUCING P-TYPENESS AND P-N JUNCTIONS IN WIDE BAND GAP SEMICONDUCTOR MATERIALS AND P-N JUNCTION SEMICONDUCTOR DEVICES, in that the methods of the copending Kun application include the formation of a surface layer of a III–V compound such as a phosphide or arsenide of gallium or indium, while the methods of the present invention contemplate pre-doping with a Group III metal alone, without the presence of Group V atoms. Direct pre-doping with the elemental Group III metal, in accordance with the present invention, has been found to yield even more stable and efficient PN-junctions, and better visible light-emitting injection diodes, than the methods described in the Kun application.

Particular preferred examples of the process of the present invention will now be described.

EXAMPLE 1

As shown in FIG. 1, a lapped and polished single-crystal sample 10 of zinc selenide is submerged in a molten alloy of 90 percent gallium and 10 percent zinc by weight within a sealed and evacuated quartz capsule 12 which is maintained at a temperature from 400° to 500° C. for 1 hour. A quartz rod 13 is contained within the capsule 12 to keep sample 10 submerged in the gallium-zinc alloy melt 11. The capsule 12 is then removed from the furnace and sample 10 is removed and placed on top of a quartz rod 14 contained in another quartz capsule 15, as shown in FIG. 2. Capsule 15 also contains non-critical amounts of zinc metal 16 and zinc selenide powder 17 in the end portion of capsule 15 adjacent quartz rod 14. The construction is such as to minimize the free volume within capsule 15, which is sealed and evacuated and placed in the furnace and maintained at a temperature of about 950° C. A temperature differential of about 10° C. is maintained between sample 10 and the zinc/zinc selenide source 16, 17, with the sample maintained at the lower temperature; this is readily achieved by proper positioning of quartz capsule 15 with respect to the temperature gradients within conventional furnaces. After removal of sample 10 and air-cooling to room temperature, the sample is found to have a surface layer with P-type conductivity and a majority carrier concentration of the order of $10^{16}$ holes per cubic centimeter. The initial substrate may either be intrinsice zinc selenide, or it may be n-doped zinc selenide prepared in accordance with the process of the above-identified Catano patent.

EXAMPLE 2

A lapped and polished single-crystal substrate 20 of intrinsic zinc sulfide is submerged in a gallium melt and maintained at about 600° C. for 1 hour, in an evacuated quartz capsule of the type shown in FIG. 1. After removal from the capsule, the sample 20 is submerged in molten zinc contained within a quartz capsule 21 (FIG. 3) which is provided with an internal quartz plunger 22 for captivating sample 20 within the zinc melt. The capsule 21 is sealed and evacuated and maintained at a temperature of about 850° C. for 3 hours. On removal and cooling of the sample, it is found to have a surface layer with P-type conductivity of the order of 500–800 ohm-centimeters as measured by the four-point probe technique, corresponding to a majority carrier concentration of the order of $10^{15}$ to $10^{16}$ holes per cubic centimeter.

EXAMPLE 3

A lapped and polished single-crystal sample of zinc selenide, doped N-type by the process of the above-identified Catano patent, is placed in an evacuated bell jar, and a surface film of gallium of a thickness of the order of 1,000 Angstroms is evaporated onto the sample. The zinc selenide sample with the gallium surface film is then placed in the position of sample 10 in a quartz capsule of the type shown at 15 in FIG. 2, which also contains metallic zinc 16 and zinc selenide 17. The capsule is sealed and evacuated and maintained at a temperature of 900° C. for 5 minutes, after which the sample is removed and air-cooled. This process yields a PN-junction having a diode resistance of about 30 ohms, corresponding to a majority carrier concentration of $10^{16}$ holes per cubic centimeter on the P-conductivity side. The sample with its PN-junction operates as a light emissive injection diode, with visible emission of a greenish yellow color.

EXAMPLE 4

A single-crystal substrate of N-doped zinc selenide is placed in a closed and evacuated quartz capsule containing metallic indium, and the capsule is heated to a temperature of about 650° C. for 20 minutes to in-diffuse indium vapor into the surface of the sample. After water-quenching of the capsule, the sample is removed and is exposed to zinc vapor, in another closed and evacuated quartz capsule, at a temperature of 850 ° C. for one-half hour. This process yields a red-light-emissive PN-junction having a majority carrier concentration on the P-side of the junction of the order of $5 \times 10^{15}$ holes per cubic centimeter.

EXAMPLE 5

A single-crystal sample of N-doped zinc selenide is submerged in an alloy of 10 percent thallium and 90 percent zinc and maintained at a temperature of about 700° C. for 1 hour. The sample is air-cooled to room temperature. This single-step process yields an orange-yellow-emissive PN-junction with a majority carrier concentration on the P-side of the junction of from $10^{16}$ to $10^{17}$ holes per cubic centimeter.

The methods of the present invention may also be employed to impart P-type conductivity to either intrinsic or N-doped substrates of wide-band gap zinc chalcogenide semiconductor materials in the production of other types of semiconductor devices, e.g., bipolar transistors, PIN diodes, and the like. In its broader aspect, therefore, the invention contemplates a method of imparting P-type conductivity to either an intrinsic or an N-type wide band gap zinc chalcogenide semiconductor material by pre-doping the material with a Group III metal, preferably gallium, to establish acceptor sites in the material and thereafter doping the pre-doped material by substitution of zinc atoms for the Group III metal at the acceptor sites.

A PN-junction semiconductor device embodying the invention and useful as an electroluminescent injection diode is shown schematically in FIG. 4. The PN-junction semiconductor device of FIG. 4 comprises a substrate 30 of N-doped zinc sulfide, N-doped zinc selenide or an N-doped zinc sulfo-selenide, and a P-type surface layer 31 on the substrate comprising a lattice of the substrate material with Group III metal acceptor sites and doped by substition of zinc atoms for the Group III metal at the acceptor sites. In the preferred embodiment schematically shown in the drawing, the Group III metal atoms are gallium. Electrodes 32 and 33 are provided to permit use of the device as an electroluminescent injection diode.

Thus the invention provides a method for imparting low resistivity P-type conductivity to wide band gap zinc chalcogenide semiconductor materials, and for making PN junctions in such materials. Visible light electroluminescent injection diodes have been produced with majority carrier concentrations on the P-side of the junction as high as $10^{16}$ to $10^{17}$ holes per cubic centimeter.

While particular embodiments of the invention have been shown and described, it will be obvious to those skilled in the art that changes and modifications may be made without departing from the invention in its broader aspects, and, therefore, the aim in the appended claims is to cover all such changes and modifications as fall within the true spirit and scope of the invention.

We claim:

1. The method of forming a PN-junction in a wide-band gap zinc chalcogenide semiconductor material which comprises:
   providing a high-conductivity N-type substrate of said zinc chalcogenide semiconductor material;
   pre-doping a surface layer of said substrate by in-diffusion of a Group III metal in elemental form to condition it for conversion to P-type conductivity;
   and converting said pre-doped layer to P-type conductivity by doping it with zinc.

2. The method of claim 1, in which said Group III metal is gallium, indium or thallium.

3. The method of claim 2, in which said Group III metal is gallium.

4. The method of claim 1, in which said pre-doping step is effected by submerging said substrate in a melt of said Group III metal.

5. The method of claim 4, in which said melt also contains zinc.

6. The method of claim 1, in which said converting step is effected by vapor-phase in-diffusion of zinc.

7. The method of claim 6, in which said substrate is zinc selenide or a zinc sulfo-selenide and said vapor-phase in-diffusion of zinc is effected in an atmosphere containing a zinc selenide vapor.

8. The method of claim 1, in which said converting step is effected by submerging the pre-doped substrate in a zinc melt.

9. The method of claim 1, in which said pre-doping step is effected by evaporating a surface layer of said Group III metal on said substrate, and by subsequently in-diffusing atoms of said Group III metal from said evaporated layer into the surface of said substrate.

10. The method of claim 9, in which said doping step is effected by in-diffusion of zinc atoms in vapor phase.

11. The method of forming a PN-junction in a wide-band gap zinc chalcogenide semiconductor material which comprises:
   forming a thin surface layer of P-convertible material on a substrate of high-conductivity N-type zinc chalcogenide semiconductor material by a surface in-diffusion of a Group III metal in elemental form to establish acceptor sites in said layer;
   and thereafter converting said surface layer to P-type conductivity by substituting zinc atoms for the Group III metal at said acceptor sites.

12. The method of claim 11, in which said Group III metal is gallium, indium or thallium.

13. The method of claim 12, in which said Group III metal is gallium.

14. The method of claim 11, in which said pre-doping step is effected by submerging said substrate in a melt of said Group III metal.

15. The method of claim 14, in which said melt also contains zinc.

16. The method of claim 11, in which said converting step is effected by vapor-phase in-diffusion of zinc.

17. The method of claim 16, in which said substrate is zinc selenide or a zinc sulfo-selenide and in which said vapor-phase in-diffusion of zinc is effected in an atmosphere containing zinc selenide vapor.

18. The method of claim 11, in which said converting step is effected by submerging the pre-doped substrate in a zinc melt.

19. The method of claim 11, in which said pre-doping step is effected by evaporating a surface layer of said Group III metal on said substrate, and by subsequently in-diffusing atoms of said Group III metal from said evaporated layer into the surface of said substrate.

20. The method of claim 19, in which said doping step is effected by in-diffusion of zinc atoms in vapor phase.

21. The method of imparting P-type conductivity to a wide band gap zinc chalcogenide semiconductor material which comprises double doping said material with a Group III metal in elemental form and with zinc.

22. The method of imparting P-type conductivity to a wide band gap zinc chalcogenide semiconductor material which comprises conditioning said material by pre-doping it with gallium or indium in elemental form and converting said pre-doped material to P-type conductivity by doping it with zinc.

23. The method of imparting P-type conductivity to a wide band gap zinc chalcogenide semiconductor material which comprises:
   pre-doping said material with gallium in elemental form to establish gallium acceptor sites in said material;
   and thereafter doping said pre-doped material by substitution of zinc atoms for gallium at said acceptor sites to establish P-type conductivity in said material.

24. A PN-junction semiconductor device comprising:
   a substrate of high-conductivity N-doped wide-band gap zinc chalcogenide semiconductor material;
   and a P-type surface layer of said substrate material containing doping concentrations of a Group III metal in elemental form and of zinc.

25. A PN-junction semiconductor device comprising:
   a substrate of n-doped zinc selenide, zinc sulfide or a zinc sulfo-selenide;
   and a P-type surface layer on said substrate comprising zinc selenide, zinc sulfide, or a zinc sulfo-selenide containing doping concentrations of a Group III metal in elemental form and of zinc.

26. The semiconductor device of claim 25, in which said Group III metal is gallium or indium.

27. A PN-junction semiconductor device comprising:
   a substrate of N-doped zinc sulfide, N-doped zinc selenide or an N-doped zinc sulfo-selenide;
   and a P-type surface layer on said substrate comprising zinc sulfide, zinc selenide or a zinc sulfo-selenide having acceptor sites consisting of atoms of a Group III metal in combination with zinc and chalcogenide atoms, at least some of said acceptor sites containing zinc atoms in excess of the stoichiometric ratio for zinc chalcogenide.

* * * * *